P-N JUNCTION PHOTOEMITTERS

Filed June 26, 1969

INVENTOR
SAMUEL A. WARD
BY Brumbaugh, Graves, Donohue & Raymond
his ATTORNEYS

United States Patent Office 3,591,424

Patented July 6, 1971

3,591,424

P-N JUNCTION PHOTOEMITTERS

Samuel A. Ward, Riverside, Conn., assignor to Columbia Broadcasting System, Inc., New York, N.Y.

Filed June 26, 1969, Ser. No. 836,874
Int. Cl. H01l 7/54
U.S. Cl. 148—1.5 9 Claims

ABSTRACT OF THE DISCLOSURE

A method of making photoemitters by ion implantation is disclosed. An n-type guard ring is diffused into the face of a p-type crystalline wafer, an n-type region is implanted within the guard ring by an ion bombardment, the p-n junction is annealed until the required reverse bias characteristic exists, and the junction is surface cesiated to obtain photoemissivity.

BACKGROUND OF THE INVENTION

This invention relates to a method of making photoemitters by ion implantation.

There is an increasing need for sensitive and fast photocells or photodetectors today. Photodetectors or photocells are devices which can convert luminous energy into an electrical signal for purposes of power conversion, control, or communication. These photoemissive cells can be used, for example, in safety and warning devices, and in counting or sorting equipment.

A typical photoemissive cell is composed of two electrodes positioned in a bulb. One electrode, an emitter plate having a photosensitive surface, is arranged so that light can easily strike its surface. The second electrode, usually a fine wire, is placed near to the plate. The cell acts as a current generator when light incident on the sensitive surface of the plate causes the photoelectric emission of electrons from the surface where they are collected by the second electrode. Usually the protective bulb is evacuated as completely as practicable to prevent loss of the electrons by scattering. In some cells a little gas may be deliberately added to make possible current amplification in the gas itself.

The photosensitive surfaces in such photoemissive devices have been made from cesiated p-n junction semiconductors. Heretofore, p-n junction photoemitters have been made by diffusion techniques wherein an n-type donor material is placed in contact with a crystal of a p-type recipient material and an n-type region is diffused into the crystal by slowly baking the junction at high temperatures.

In the present invention the p-n junction of the photoemitter is formed by bombarding the surface of a p-type semiconductor while under a vacuum with an ion beam of an element effective to form an n-type region in the bombarded area. P-n junctions have been formed by ion bombardment, but their use has been limited to transistors and the like. Methods of forming implanted p-n junctions have been described in the literature such as, D. B. Medved et al., Implantation and Channeling Effects of Alkali Ion Beams in Semiconductors, 38 Nuclear Instruments and Methods, 175–177, North-Holland Publishing Co. 1965.

The ion implantation method consists of directing a beam of a suitable ion at a clean crystalline wafer of a p-type semiconductor. The wafer and ion beam source are positioned so that a specific crystalline direction of the wafer is in axial alignment with the source. The implantation is generally carried out in a vacuum and at moderately elevated temperatures.

SUMMARY OF THE INVENTION

The present invention applies the ion implantation method to the formation of p-n junction photoemitters.

With a clean, p-type wafer placed in a vacuum apparatus containing an ion source and with a specified crystalline direction in axial alignment with such source, an n-type guard ring is first diffused into the face of such wafer, an n-type region is implanted within such guard ring by an ion bombardment, the p-n junction is then annealed, and finally, the junction is surface cesiated.

In such invention, the recipient wafer is of a p-type semiconductor such as silicon, gallium arsenide, etc., and the ion source is of a type which, when implanted will form an n-type region. For example, where silicon is the recipient base, the implanted ion may be cesium, sodium, etc.

This method results in p-n junction photoemitters with improved reverse current breakdown characteristics and less chance to contain harmful contaminants which might reduce their efficiency or lifetime.

The improved reverse voltage breakdown characteristic is of great practical importance because it makes possible the construction of cells having improved sensitivity.

The lack of contaminants is also of great importance as it results in increased efficiency or lifetime. An implanted p-n junction diode is less likely to contain deleterious impurities than a diffused diode because the implantation process is carried out at lower temperatures and under a vacuum. The higher temperatures required and the atmospheric impurities present in making diffused junctions cause more contaminants to be baked or diffused into the crystalline wafer.

BRIEF DESCRIPTION OF THE DRAWINGS

The invention will be more fully understood when the following description is considered in connection with the accompanying illustrative drawings in which.

DESCRIPTION OF THE PREFERRED EMBODIMENTS

Figure 1:
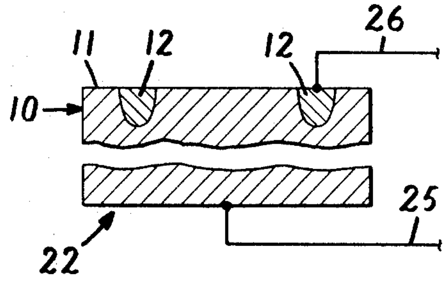
FIG. 1 is a diagrammatic cross section of a p-type crystalline wafer having an n-type guard ring diffused into it.

Referring to the drawings in detail, FIG. 1 schematically illustrates a wafer prepared for treatment by the present invention. A p-type crystalline wafer 10 of the desired semiconductor, for example, silicon, is cut or prepared so that it has a plane surface 11. The surface plane 11 is perpendicular to a specified crystalline axis, for example, <111>. The surface 11 is also cleaned, for example, by polishing and etching, to remove any oxide layers that have formed on it.

A ring-shaped area 12 of an n-type material, for example antimony, is formed on the surface 11 by standard semiconductor diffusion techniques. For example, a mask for a guard ring 12 having an internal diameter of 0.2 inch is positioned on the surface of the wafer and a suitable thickness of an n-type material is diffused into the body of the wafer by heating, or by some similar method. The diffused guard ring 12 serves to make contact with the later implanted n-region 20 (FIG. 3) within the guard ring 12 and also serves to eliminate edge effects at the p-n surface interface 13. It is to be understood that the crystalline wafer 10 and the ring 12 can be of any size and shape.

Figure 2:
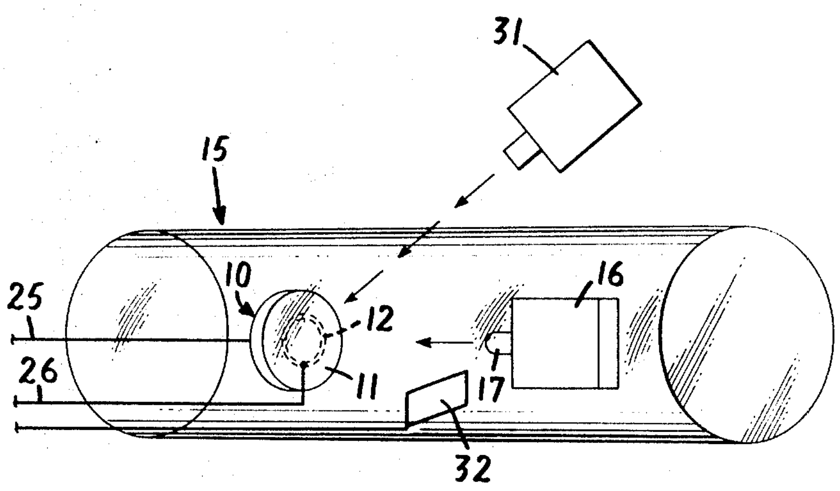
FIG. 2 is a schematic view (not to scale) of an apparatus for practicing the present invention.

After the diffusion of the guard ring 12 has been completed, excess material is removed. Suitable electrical contacts 25 and 26 are fixed to the back side 22 of the wafer 10 and to the guard ring 12, respectively, and the crystalline wafer 10 is mounted (via conventional means not shown) in a vacuum apparatus 15 as shown in FIG. 2.

In the vacuum apparatus 15, the prepared and cleaned wafer 10 is mounted with a specified crystalline axis in alignment with a suitable donor ion source 16. The ion beam from the ion source 16 will thus strike the crystalline wafer 10 perpendicular to the prepared surface 11. The crystal orientation is important because it affects the penetration ability of the ions to be implanted. For example, in bombardment of cesium ions into a silicon wafer 10, the deepest junctions are formed along the <110> direction, followed by the <111> direction, and then by the <100> direction.

The source 16 of the ions is of a conventional nature. The source 16 can have, for example, a porous tungsten contact ionizer 17 to flow the ions into the system.

Figure 3:
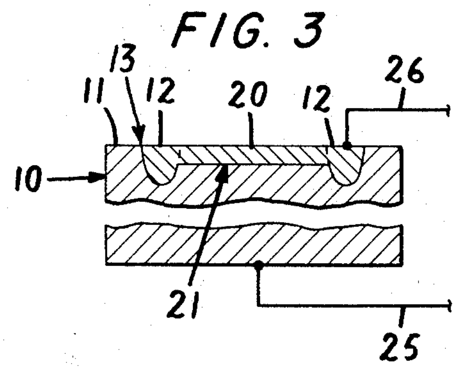
FIG. 3 is a schematic cross-sectional view of a p-n junction diode after ion implantation of the n-type region within the guard ring.

The ion source 16 cleans the wafer 10 by ion bombardment and implants the ions to a suitable depth, for example, 50 to 200 A., within the area enclosed by the diffused guard ring 12. The implanted region 20, as shown in FIG. 3, becomes n-type forming the p-n junction 21 of the photoemitter. The implanted ions are electrically active donors and are used as a source of photoelectrons.

It has been shown that any oxide layers left on the wafer 10 during the ion bombardment will reduce the effective depth of the junction. Consequently, the wafer 10 must be clean before implantation. This is effected by operating the beam source 16 at a low energy, for example, 100 to 200 electron volts, for a short period of time, for example, 10 minutes.

During implantation the absolute pressure in the vacuum apparatus 15 is maintained at not more than $1\times10^{-6}$ Torr and the energy of the ion source 16 is typically 5 to 10 kiloelectron volts. The vacuum condition in effect during bombardment keeps the ion beam from scattering and reduces the possibility of deleterious contamination of the p-n junction diode.

The temperature during implantation is to be within the range, 500° to 700° C. The temperature substantially influences the junction depth, and also helps anneal radiation damage caused by the implantation process.

Ion bombardment is continued until a doping density of approximately $10^{19}$ per cubic centimeter is reached. The doping density is determined by the total charge and the depth of the implantation. The total charge is controlled by measuring ion current and integrating with time. The depth of implantation is controlled by the temperature of the wafer 10 during the implantation. The percent activity of the total charge is determined by the annealing of implantation induced damage and by lattice substitution and/or interstitial doping influenced by crystalline wafer 10 temperature during and subsequent to implantation.

When an ion is implanted into a crystal semiconductor such as silicon, it can act as an impurity or dopant in the semiconductor by either (1) interstitial doping, (2) substitutional doping, or (3) bombardment damage; the latter can be eliminated by an annealing process. For a material from Group IV of the Periodic Table of elements, of which silicon and germanium are the most commonly used, substitutional doping is achieved by implanting an ion of a Group III element, such as indium, or of a Group V element, such as antimony. Interstitial doping is accomplished by implanting an ion of a Group I element, such as cesium, to convert p-type silicon into n-type.

Since to develop photooemissive properties the surface of the p-n junction thus formed is cesitated, it is usually most convenient to use cesium as the dopant.

The doping profile of the n-type region formed within the p-type body differs substantially depending on whether the n-type region is formed by diffusion or ion implantation techniques. Diffusion techniques result in an n-type doping profile which has its maximum concentration at the surface of the wafer and which decreases logarithmically in concentration beneath such surface. Implantation techniques, on the other hand, produce a doping profile which increases to a maximum below the surface of the wafer and then exponentially decreases in concentration. The exponential concentration characteristic of ion implanted doping profiles is called "tailing" and is caused by channeling, whereby incident particles traveling in certain favored crystal directions undergo only glancing collisions and penetrate deep into the crystal.

Ion implantation techniques produce a doping density $10^5$ or more larger than that possible by diffusion techniques. The densities achieved by ion implantation of cesium in silicon are greater than $1\times10^{19}$/cm.$^3$.

After implantation has been completed, the wafer may be maintained at the implantation temperature for a short period of time, say, several minutes, to finish the annealing of the radiation damage in the crystalline wafer 10. It is understood, however, that annealing after completion of implantation is not always necessary or desirable.

When annealed and cooled to room temperature, the p-n junction is tested for its reverse bias characteristic. This essentially involves the measurement of current as a function of voltage between the contact 25 on the non-bombarded side 22 of the crystalline wafer 10 and the contact 26 on the n-type guard ring 12 when the contact 25 is negative with respect to the contact 26. Excellent reverse bias characteristics over 100 volts are obtained from such implanted diodes. When preparing diodes by the present invention, the reverse bias characteristics should be such that at 100 volts bias, the current is at a minimum. This prevents the diode from overheating and minimizes dark current. If such a reverse bias characteristic is not achieved, the crystalline wafer 10 is further annealed until it is reached.

Figure 4:
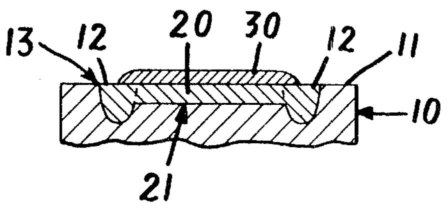
FIG. 4 is a schematic cross-sectional view of a completed photoemitter.

After the desired reverse bias characteristic is achieved and with the wafer 10 still mounted in the apparatus 15, the surface 11 of the wafer 10 is coated with a thin layer of cesium 30 as shown in FIG. 4. This process is called cesiation. The cesium layer 30 is coated on the surface 11 by the use of a low energy ion beam, for example, 6 to 10 electron volts energy. The ion beam can be produced, for example, by the same ion source 16 used for ion implantation. Cesiation takes place with the system at room temperature and under a vacuum pressure of approximately $10^{-9}$ Torr until peak photoemission is reached. The optimum surface deposition of the cesium is believed to correspond to one-half monolayer. In practice, however, surface cesiation is adjusted to optimize the photoemissive characteristics. The photoemissivity of the cesiated surface is measured by arranging a suitable light source 31, as shown in FIG. 2, so that it will strike the surface 11 of the wafer 10. A collection electrode 32 and a suitable current measuring means (not shown) are provided to determine the efficiency of the photoemission.

At this point the photocathode-emitter is completed and ready for use.

I claim:

1. In a method of making a p-n- junction photoemitter the improvement comprising the steps of:

(a) mounting a body of a p-type semiconductor material in a vacuum apparatus containing means for generating an ion beam from a material effective to convert said p-type semiconductor material to an n-type semiconductor material when alloyed therewith, said semiconductor having a crystalline axis aligned with said means and having a surface transverse to the aligned axis facing said means;

(b) bombarding said surface of said p-type body with ions from said generating means while the pressure within said vacuum apparatus does not exceed $10^{-6}$ Torr, under conditions effective to form an implanted n-type region therein; and (c) cesiating said surface of said body sufficiently to obtain photoemissive characteristics.

2. A method as defined in claim 1, further comprising the step of maintaining said p-type semiconductor at a temperature of 500° to 700° C. during ion bombardment and for a sufficient time after termination of ion bombardment to yield a reverse bias breakdown characteristic of at least 100 volts.

3. A method as defined in claim 1, further comprising the initial step of diffusing an n-type guard ring into said surface on said p-type body to define an enclosed target area for said ion beam.

4. A method as defined in claim 1, further comprising the step of cleaning said surface of said p-type body prior to said implantation by bombardment thereof with an ion beam from said generating means having an energy of 100 to 200 electron volts.

5. A method as defined in claim 1, wherein the temperature in said vacuum apparatus during said ion implantation is 500° to 700° C.

6. A method as defined in claim 1, wherein said ions are implanted to a density of approximately $10^{19}$ per cubic centimeter.

7. A method as defined in claim 1, wherein said ions are implanted to a depth of 50 to 200 A.

8. A method as defined in claim 1, wherein the pressure in said vacuum apparatus during said cesiation is approximately $10^{-9}$ Torr.

9. A method as defined in claim 1, wherein said cesiation is carried out by an ion beam of 6 to 10 electron volts energy.

References Cited

UNITED STATES PATENTS

| | | | |
|---|---|---|---|
| 3,387,161 | 6/1968 | Vanhaar et al. | 313—94 |
| 3,523,042 | 8/1970 | Bower et al. | 148—1.5 |

L. DEWAYNE RUTLEDGE, Primary Examiner

R. A. LESTER, Assistant Examiner

U.S. Cl. X.R.

29—576; 148—186